United States Patent
Vaturi

(10) Patent No.: US 10,524,033 B2
(45) Date of Patent: Dec. 31, 2019

(54) EXPANDABLE ENCLOSURE FOR ELECTRONIC DEVICE RESONANCE BOX

(71) Applicant: Microsoft Technology Licensing, LLC, Redmond, WA (US)

(72) Inventor: Efri Efraim Vaturi, Petach-Tikva (IL)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 15/967,322

(22) Filed: Apr. 30, 2018

(65) Prior Publication Data
US 2019/0335258 A1  Oct. 31, 2019

(51) Int. Cl.
  *H04R 1/02* (2006.01)
  *H05K 5/00* (2006.01)
  *G06F 1/16* (2006.01)
  *H05K 5/02* (2006.01)

(52) U.S. Cl.
  CPC .......... *H04R 1/025* (2013.01); *G06F 1/1616* (2013.01); *H04R 1/028* (2013.01); *H05K 5/0017* (2013.01); *H05K 5/0226* (2013.01)

(58) Field of Classification Search
  CPC combination set(s) only.
  See application file for complete search history.

(56) References Cited

U.S. PATENT DOCUMENTS

| 4,601,361 | A | * | 7/1986 | Nakada | G10H 1/32 181/141 |
| 5,732,140 | A | * | 3/1998 | Thayer | G06F 1/1616 181/154 |
| 6,151,401 | A | * | 11/2000 | Annaratone | G06F 1/1616 361/679.23 |

(Continued)

FOREIGN PATENT DOCUMENTS

DE  2020170107455 U1  1/2018

OTHER PUBLICATIONS

"DEMO: Boost Micro Speaker Sound with TFA9887 Mobile Audio System from NXP" NXP Semiconductors. Published on Jul 17, 2012. 2 pages. Available at https://www.youtube.com/watch?v=oLMXCTvCB70.

(Continued)

*Primary Examiner* — Lisa Lea-Edmonds
(74) *Attorney, Agent, or Firm* — Alleman Hall Creasman & Tuttle LLP

(57) ABSTRACT

An electronic device, comprises a display and an expandable enclosure positioned opposite the display. The expandable enclosure is operable between at least a closed configuration and an open configuration, such that in the open configuration, the expandable enclosure defines faces of a resonance box. One or more speakers include a speaker cone and a drive magnet assembly. Each of the one or more speakers is positioned on an outer surface of the expandable enclosure and oriented so that the drive magnet assembly faces an interior of the resonance box, and so that the speaker cone (Continued)

faces an exterior of the resonance box. In this way, the electronic device gains the benefit of amplifying audio via the resonance box without adding significantly to the device volume or requiring an auxiliary speaker system.

20 Claims, 12 Drawing Sheets

(56) References Cited

U.S. PATENT DOCUMENTS

| | | | | |
|---|---|---|---|---|
| 6,324,052 | B1* | 11/2001 | Azima | G06F 1/1616 361/679.23 |
| 6,353,529 | B1* | 3/2002 | Cies | G06F 1/1616 248/917 |
| 6,519,346 | B1* | 2/2003 | Asada | H04R 5/02 381/152 |
| 6,600,827 | B2* | 7/2003 | Lu | G06F 1/1605 248/316.4 |
| 6,621,908 | B2* | 9/2003 | Asada | H04R 5/02 381/152 |
| 6,731,764 | B2* | 5/2004 | Asada | H04R 5/02 381/152 |
| 6,760,456 | B1* | 7/2004 | Annaratone | G06F 1/1616 361/679.55 |
| 6,760,460 | B1* | 7/2004 | Jeon | H04N 5/642 181/198 |
| 6,804,367 | B2* | 10/2004 | Asada | H04R 5/02 381/152 |
| 7,245,729 | B2* | 7/2007 | Bank | H04R 1/025 381/152 |
| 7,593,536 | B2* | 9/2009 | Sung | G03B 31/00 381/312 |
| 7,760,494 | B2* | 7/2010 | Policar | F16M 11/22 248/918 |
| 8,085,963 | B2* | 12/2011 | Solland | G06F 1/1632 381/333 |
| 8,121,329 | B2* | 2/2012 | Groset | H04R 5/02 381/333 |
| 8,265,319 | B2* | 9/2012 | Groset | H04R 5/02 361/679.23 |
| 8,369,561 | B2* | 2/2013 | Bhutani | H04R 5/02 381/332 |
| 8,649,166 | B2* | 2/2014 | Wu | G06F 1/1601 361/679.27 |
| 9,116,670 | B2* | 8/2015 | Jenkins | G06F 1/166 |
| 9,176,538 | B2* | 11/2015 | Boulanger | G06F 1/1684 |
| 9,189,019 | B2* | 11/2015 | Jenkins | G06F 1/1616 |
| 9,351,061 | B1 | 5/2016 | Wollersheim et al. | |
| 9,367,090 | B2 | 6/2016 | Barnett et al. | |
| 9,575,515 | B2* | 2/2017 | Leon | G06F 1/1681 |
| 9,973,852 | B1* | 5/2018 | Hesketh | H04R 3/04 |
| 2010/0304795 | A1* | 12/2010 | Laine | F16M 13/00 455/575.1 |
| 2012/0092377 | A1* | 4/2012 | Stein | F16M 11/041 345/649 |
| 2013/0188821 | A1* | 7/2013 | Schul | H04R 1/026 381/394 |
| 2014/0064503 | A1 | 3/2014 | Ko et al. | |
| 2014/0079266 | A1* | 3/2014 | Szymanski | H04R 1/02 381/334 |
| 2015/0049895 | A1* | 2/2015 | Walter | H04R 1/2811 381/345 |
| 2015/0125019 | A1* | 5/2015 | Porter | H04R 1/026 381/333 |
| 2017/0023975 | A1* | 1/2017 | Nalbandian | H04R 1/028 |
| 2017/0055054 | A1 | 2/2017 | Brogan | |

OTHER PUBLICATIONS

"International Search Report and Written Opinion Issued in PCT Patent Application No. PCT/US2019/027401", dated Jul. 3, 2019, 15 Pages.

* cited by examiner

EXPANDABLE ENCLOSURE FOR
ELECTRONIC DEVICE RESONANCE BOX

BACKGROUND

Portable electronic devices, such as laptop computers, tablet computers, and cell phones may include built-in speakers to generate audible sound. Such speakers enable users to utilize their electronic devices as speakerphones, music players, video players, gaming devices, etc. without using headphones or placing their ear in near-proximity to the device. Such electronic devices may be configured to self-support a display device, allowing the user to view audio/visual content while the device is placed on a lap, desktop, or other surface.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

An electronic device comprises a display and an expandable enclosure positioned opposite the display. The expandable enclosure is operable between at least a closed configuration and an open configuration, such that in the open configuration, the expandable enclosure defines faces of a resonance box. One or more speakers include a speaker cone and a drive magnet assembly. Each of the one or more speakers is positioned on an outer surface of the expandable enclosure and oriented so that the drive magnet assembly faces an interior of the resonance box, and so that the speaker cone faces an exterior of the resonance box. In this way, the electronic device gains the benefit of amplifying audio via the resonance box without adding significantly to the device volume or requiring an auxiliary speaker system.

DETAILED DESCRIPTION

Portable electronic devices are widely used in daily life. To increase portability, the manufacturers often attempt to provide the maximum functionality of the device with lowest attainable size and weight. As a result, the electronic devices may be extremely thin, and thus may have limited space in which to install and support hi-fidelity audio components. Small, thin speakers may result in poor-quality, tinny sounding audio output that distorts easily with increased volume. In particular, audio generated without bass frequencies is strident and has no depth. The lack of a resonance box in such devices means that the audio will suffer from attenuation at low frequencies, providing the user with a poor audio experience.

Numerous solutions to this problem have been proposed, but each has its own limitations. The electronic device may be connected to an external speaker system (typically a digital speaker) using wired or wireless connections. However, this decreases the portability of the electronic device by requiring the user to bring additional componentry for audio features. In some examples, the power (e.g., Wattage) of the electronic device's internal amplifier and speaker may be increased. This may result in a modest increase in low frequency output, but is not efficient, wasting power and chassis space, while increasing the weight of the device.

In some examples, more efficient speakers may be applied, though this solution is limited and may increase production costs. The speakers may be paired with a Class D amplifier which has I/V sensing capability and a digital signal processing system. Such a system may amplify the low frequencies to the maximum peak allowed by the speaker, at the digital level. However, the speaker still lacks a resonance box with which to generate low frequency soundwaves, and thus may still be prone to distorting.

Herein, numerous examples are provided that selectively create a space within the footprint of portable devices such as laptops, tablets, smartphones, etc. that may be used as a resonance box or subwoofer. By placing speakers on the resonance box, low frequencies may be efficiently amplified, achieving significant audio boosting. This enables the portable electronic device to be used as a music box, thus enabling a user to listen to high quality audio, generate high fidelity audio conferencing, etc. The resonance box may fold into to a housing or case of the portable electronic device, allowing for an audio system that takes advantage of the features of the device (e.g., internet connectivity, applications, data storage, etc.) without compromising portability.

Figure 1:
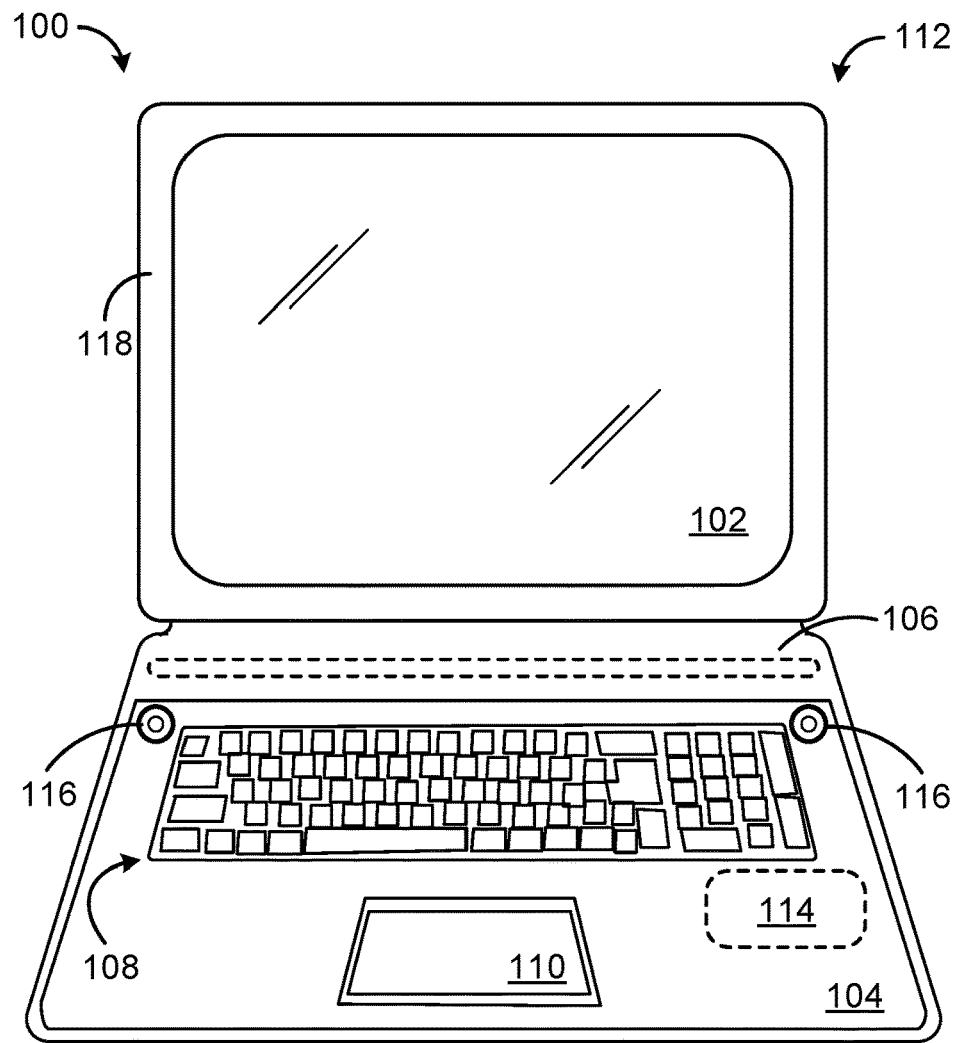
FIG. 1 shows an example electronic device.
Figure 2:
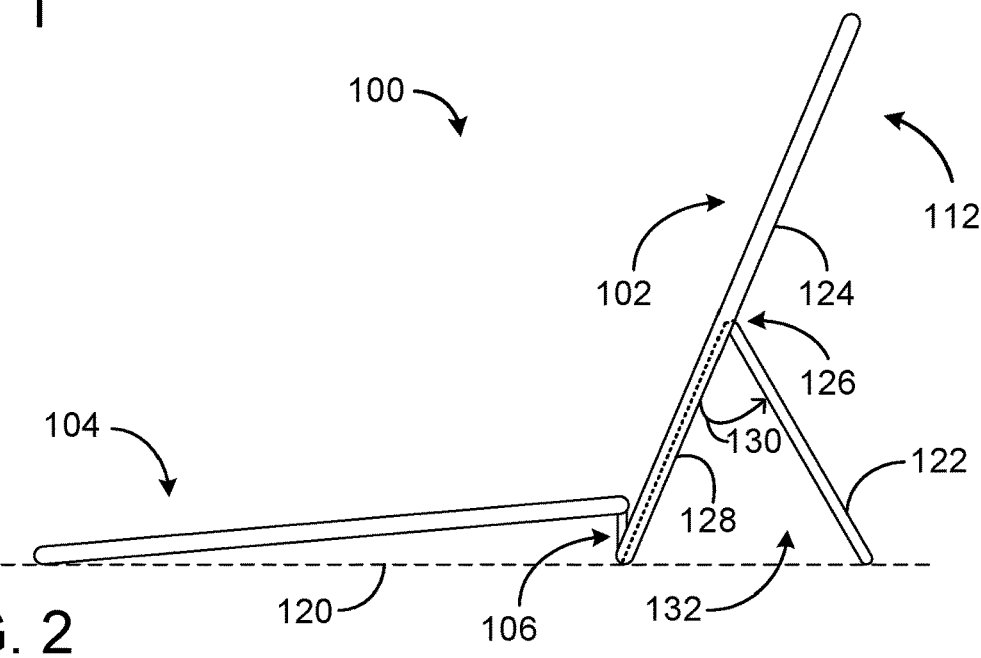
FIG. 2 shows a profile view of the electronic device of FIG. 1.

FIGS. 1 and 2 depict an example electronic device 100. Electronic device includes a display 102 that is physically and communicatively coupled to an input module 104 via a flexible hinge 106. Input module 104 is shown as including an input portion that includes a keyboard 108 having a QWERTY arrangement of keys and track pad 110 although other arrangements are also contemplated. Further, other non-conventional configurations are also contemplated, such as a game controller, a configuration to mimic a musical instrument, and so forth. Thus, the input module 104 and keys incorporated by the input module 104 may assume a variety of different configurations to support a variety of different functionality. Display 102 may be configured as a touch-sensitive display, and may thus be configured to identify touch gestures and cause operations to be performed that correspond to the touch gestures Flexible hinge 106 may be included in a device housing 112 that may be positioned around at least the rear of display 102 and around input module 104. Other components may be housed within device housing 112, such as an energy storage device 114, a logic machine, a storage machine, communication components, etc. Electronic device 100 includes a pair of speakers 116. In this example, speakers 116 are shown coupled to input module 104, but in other configurations, speakers 116 may be positioned elsewhere, such as on a bezel 118 or outer edge of display 102. While two speakers are shown, more or fewer speakers may be included. Although speakers 116 are depicted as round speakers, other shapes and configurations may be used. Speaker drivers for speakers 116, display 102, aspects of input module 104, and/or other components of electronic device 100 may be powered via energy storage device 114.

The flexible hinge 106 may be flexible in that rotational movement supported by the hinge is achieved through flexing (e.g., bending) of the material forming the hinge. Further, this flexible rotation may support movement in one or more directions (e.g., vertically) yet restrict movement in other directions, such as lateral movement of the input module 104 in relation to the display 102. This may be used to support consistent alignment of the input module 104 in relation to the display 102. Additionally, rotational movement may be supported by flexible hinge 106 such that the input module 104 may be placed against display 102 of electronic device 100 and thereby act as a cover.

Flexible hinge 106 may house componentry, such as flex circuitry and cables, connecting input module 104 with display 102. In some examples, input module 104, display 102, flexible hinge 106 and device housing 112 may be configured as a single device. In other examples, display 102 may be reversibly detachable from input module 104. For example, display 102 may be a tablet computer. In such examples, flexible hinge 106 may include a plurality of connectors, which may be used to physically and communicatively couple input module 104 to an external electronic device, such as display 102. Flexible hinge 106 may thus be used to house components and circuitry of input module 104, and may further provide a magnetic and/or physical anchoring point for allowing input module 104 and display 102 to be used akin to a laptop form function as shown.

FIG. 2 shows a profile view of electronic device 100 in one usage conformation, such as a typing orientation. As shown, input module 104 and flexible hinge 106 lay on a support surface 120 (dashed line). This conformation allows viewing of display 102, which may be maintained at a viewing angle through the deposition of kickstand 122 against support surface 120. Kickstand 122 may be disposed on a backing 124 of device housing 112, where backing 124 is located opposite the display surface of display 102. In some examples, kickstand 122 may be employed as a support component to enable a variety of different orientations and usage conformations for electronic device 100.

Kickstand 122 may be rotatably connected to backing 124 of device housing 112 via one or more hinges 126. Kickstand 122 may be movable between at least an open configuration (as shown in FIG. 2) and a closed configuration. In the open configuration, kickstand 122 may support display 102 when resting on support surface 120. In the closed configuration, kickstand 122 may be configured to be flush with backing 124, for example by rotating into recess 128 of backing 124.

In some examples, kickstand 122 may be operable only between the closed and open configurations (e.g., via rotational movement 130). In such examples, hinge 126 may stop rotation of kickstand 122 at a predetermined maximum angle. However, in other examples, kickstand 122 may be operable to one or more intermediate configurations between the closed and open configurations so as to allow a user to customize the usage conformation of electronic device 100. Intermediate configurations may be accessed over a continuum (e.g., using a friction based hinge mechanism) or at discrete intervals. In some examples, movement of kickstand 122 from the closed configuration to the open configuration and/or any intermediate configurations may be driven by one or more motors, springs, and/or other automated mechanisms.

When kickstand 122 is in an open (or intermediate) configuration, an expandable enclosure 132 is generated. In this depiction, expandable enclosure 132 is defined by support surface 120, kickstand 122, and backing 124. These three faces are all rigid or semi-rigid, and create a space beneath electronic device 100 that can be exploited to boost the audio capabilities of electronic device 100 if a microspeaker is attached to expandable enclosure 132 and the open sides are closed off to generate a sealed or semi-sealed volume. Expandable enclosure 132 may then be utilized as a resonance box, in particular for bass frequencies.

Figure 3:
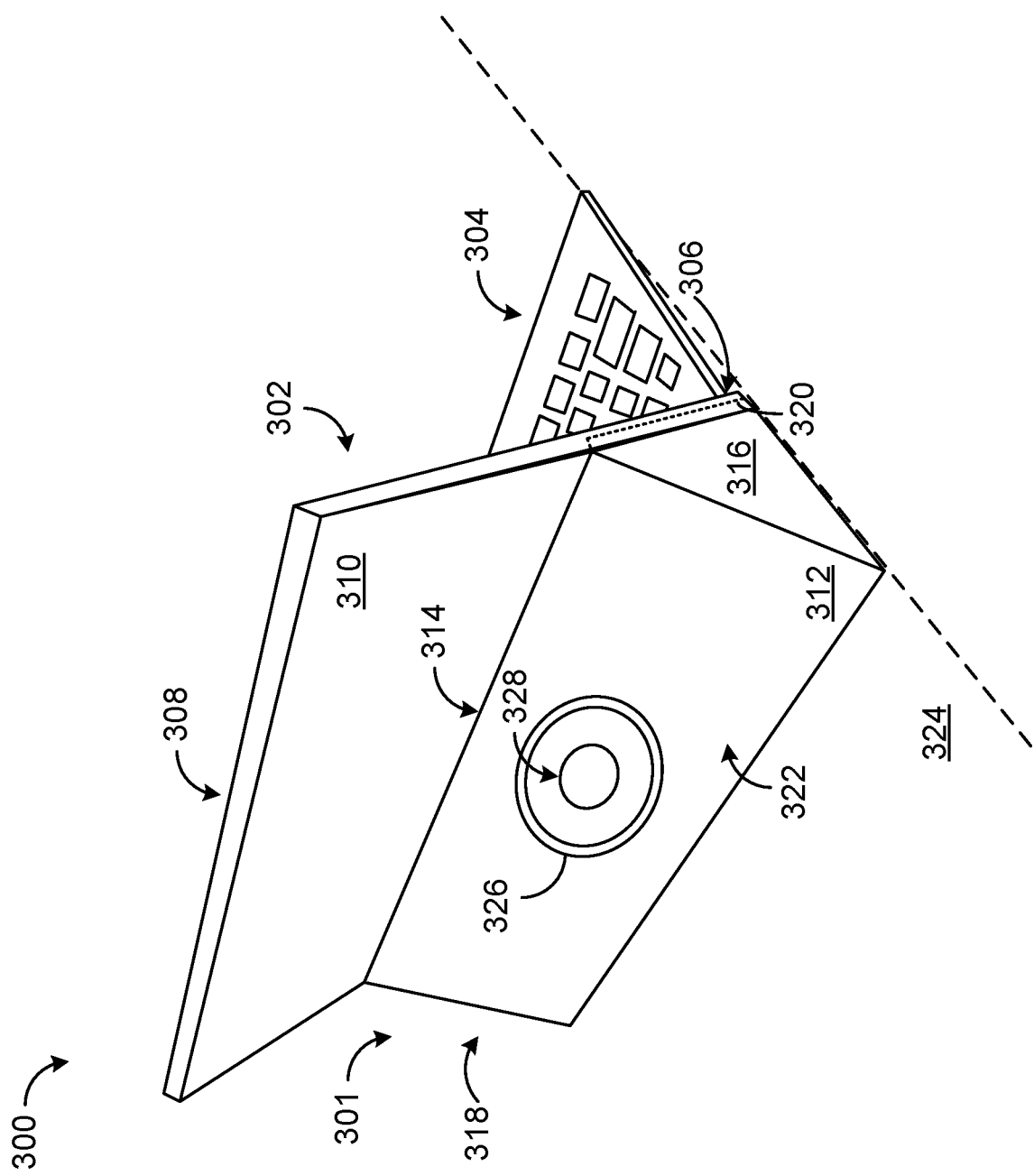
FIG. 3 shows an example electronic device including a speaker affixed to a kickstand.

As an example, FIG. 3 shows an electronic device 300 including an expandable enclosure 301. Electronic device 300 includes display 302, input module 304, flexible hinge 306, device housing 308, device backing 310, kickstand 312, hinge 314, and other components described with regard to electronic device 100.

In this example, expandable enclosure 301 includes device backing 310, kickstand 312, and hinge 314, as well as first collapsible sidewall 316 and second collapsible sidewall 318 (occluded by kickstand 312 in FIG. 3). First and second collapsible sidewalls 316 and 318 are attached to and/or sealed against both kickstand 312 and device backing 310. In a closed configuration, such as when kickstand 312 is folded into device backing 310, collapsible sidewalls 316 and 318 are flattened between kickstand 312 and device backing 310. For example, first collapsible sidewall 316 and second collapsible sidewall 318 may be stowed into a recess 320 of device backing 310. Examples configurations for collapsible sidewalls are described herein and with regard to FIGS. 5-7.

First collapsible sidewall 316 and second collapsible sidewall 318 may be fabricated from any suitable, rigid or semi-rigid material, such as rigid plastic, metal, composite material, etc. First collapsible sidewall 316 and second collapsible sidewall 318 may be designed such that, when in the open configuration, the volume of expandable enclosure 301 is maintained within a threshold of a predetermined volume.

Device backing 310, kickstand 312, first collapsible sidewall 316, and second collapsible sidewall 318 define four faces of resonance box 322. In this example, the fifth face of resonance box 322 is defined by support surface 324. Support surface 324 may be a table, desktop, or other rigid surface capable of forming a substantially airtight seal with expandable enclosure 301, and further capable of maintaining a resonance within a threshold of constancy over time. In other examples, such as the example described herein with regard to FIG. 8, the fifth side of a resonance box may be defined by an additional collapsible wall. In order to form a substantially airtight seal, the edges of device backing 310, kickstand 312, first collapsible sidewall 316, and second collapsible sidewall 318 that face support surface 324 may be lined with gaskets, suction seals, or other suitable sealing mechanisms.

Resonance box 322 may be utilized as a speaker, subwoofer, or other acoustic resonator when paired with one or more speakers 326. Speaker 326 may be a micro speaker, such as those commonly used in mobile phones and other electronic devices. Micro speakers offer an advantage in that they are relatively thin, and thus may not add significant depth to the sides of resonance box 322.

As shown in FIG. 3, speaker 326 is located on a face of kickstand 312. Speaker 326 may be oriented so that a drive magnet assembly (not shown) faces an interior of resonance box 322, and so that a speaker cone 328 faces an exterior of resonance box 322. Electronic device 300 is shown with one speaker 326, but in other examples, multiple speakers may be included. Although depicted herein as a traditional speaker assembly including a cone and drive magnet, other speaker types may also be used, such as piezoelectric speakers and Micro ElectroMechanical Systems (MEMS) speakers, for example.

Figure 4:
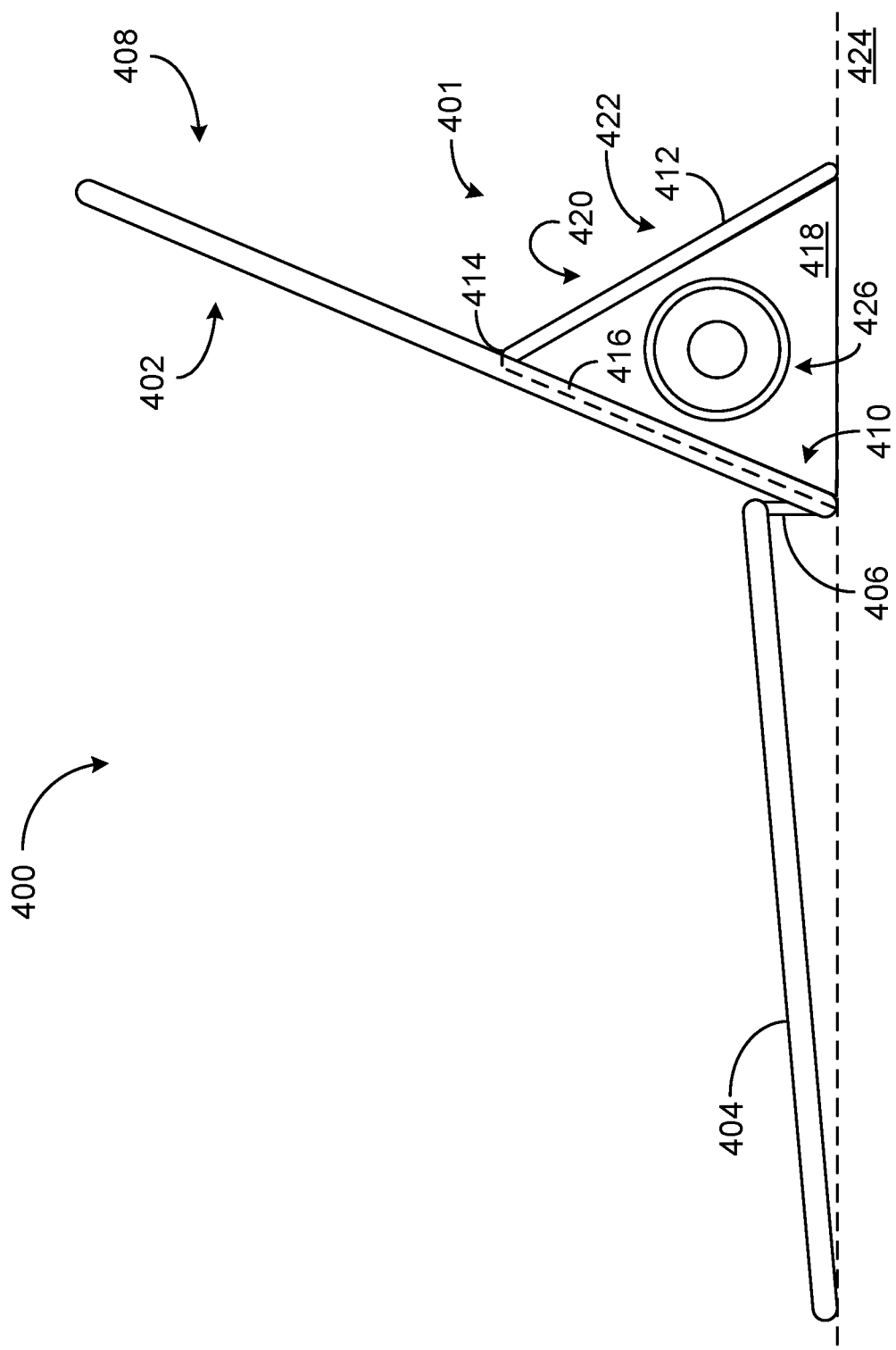
FIG. 4 shows an example electronic device including a speaker affixed to a collapsible side panel.

FIG. 4 shows one such example. FIG. 4 shows an electronic device 400 including an expandable enclosure 401. Electronic device 400 includes display 402, input module 404, flexible hinge 406, device housing 408, device backing 410, kickstand 412, hinge 414, recess 416, and other components described with regard to electronic device 100. Electronic device 400 further includes a first collapsible sidewall 418, second collapsible sidewall 420 (occluded by, and positioned opposite first collapsible sidewall 418). Faces of a resonance box 422 are defined by device backing 410, kickstand 412, first collapsible sidewall 418, second collapsible sidewall 420, and support surface 424. In this example, a first speaker 426 is placed on first collapsible sidewall 418, and a second speaker (not shown) is placed on second collapsible sidewall 420.

Speakers positioned on a resonance box, such as speakers 326 and 426 may be coupled to and driven by an amplifier within the parent electronic device. As an example, a drive amplifier may be a class D amplifier or other relatively thin amplifier that offers high efficiency speaker driving. Such amplifiers may be positioned outside of the expandable enclosure, such as within a display, such as display 302, within an input module, such as input module 304. Wires may be routed between the amplifier and the speaker, through the device housing. Such wiring may be relatively thin, but may be relatively wide in order to carry enough current to drive the speaker(s). However, in some examples, the amplifier may be positioned within the expandable enclosure, provided the amplifier is thin enough to be encased within one of the faces of the enclosure. In examples where class D amplifiers are used, placing the amplifier relatively close to the speaker(s) may enable a filterless connection, thus reducing manufacturing costs and complexity without increasing electromagnetic interference (EMI). If the speaker and amplifier are further apart, a filter may be used to reduce the occurrence of electromagnetic interference. For other amplifier types, such as class A and class AB, the amplifier and speaker(s) may be connected without a filter there between.

If two or more speakers are provided, the amplifier may provide each speaker with the same signal, or may provide them with different signals (e.g., stereo). In examples wherein the electronic device includes built-in speakers, (e.g., speakers 116), the built-in speakers may be designated as high-frequency speakers, while the speaker(s) positioned on the resonance box may be designated as low-frequency speakers. In other words, high-frequency components of audio signals may be sent to the built-in speakers, and low-frequency components of audio signals may be sent to the speaker(s) positioned on the resonance box. However, a user may be provided with the option to bypass the built-in speakers, and thus both high and low frequency audio signals may be provided to the speaker(s) positioned on the resonance box.

In examples where two or more speakers are provided, a dividing wall or other means of isolating each speaker may also be provided. In some examples, the dividing wall may be a collapsible dividing wall. In some examples, the collapsible dividing wall may be selectively deployed. For example the collapsible dividing wall may be deployed when operating the speaker(s) positioned on the resonance box in a stereo mode, but may not be deployed when operating the speaker(s) positioned on the resonance box as a mono subwoofer. Additionally or alternatively, other resonance features and topography may be provided on the interior faces of the kickstand, device backing, sidewalls, etc.

Figure 5:
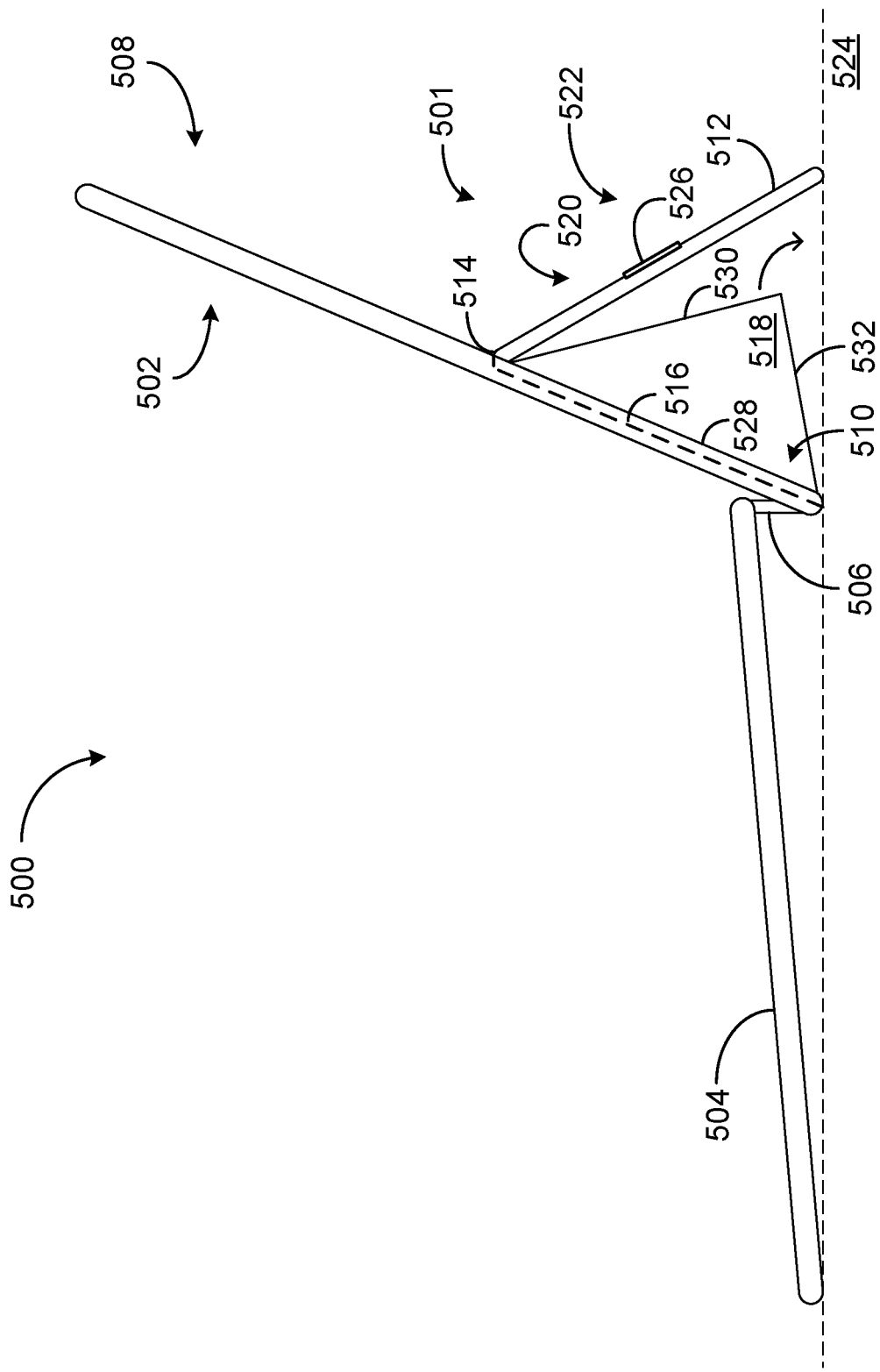
FIGS. 5-7 show example electronic devices including expandable enclosures with collapsible side panels.

FIG. 5 shows an example electronic device 500 having one configuration for collapsible sidewalls. Electronic device 500 includes an expandable enclosure 501, display 502, input module 504, flexible hinge 506, device housing 508, device backing 510, kickstand 512, hinge 514, recess 516, and other components described with regard to electronic device 100. Electronic device 500 further includes a first collapsible sidewall 518, second collapsible sidewall 520 (occluded by, and positioned opposite first collapsible sidewall 518). Faces of a resonance box 522 are defined by device backing 510, kickstand 512, first collapsible sidewall 518, second collapsible sidewall 520, and support surface 524. In this example, speaker 526 is placed on kickstand 512.

In this example, first collapsible sidewall 518 is configured as a single, hinged flap. First collapsible sidewall 518 has three sides, first side 528, second side 530, and third side 532. First side 528 may be coupled to device backing 510 via a hinge or other suitable mechanism. In a closed configuration, first collapsible sidewall 518 may thus fold into recess 516. In an open configuration, first collapsible sidewall 518 may fold outward from recess 516, so that second side 530 mates with kickstand 512, and so that third side 532 is flush against support surface 524. When both first collapsible sidewall 518 and second collapsible sidewall 520 are deployed into an open conformation, resonance box 522 may be formed.

In some examples, first collapsible sidewall 518 and/or second collapsible sidewall 520 may include one or more speakers. In such examples, the collapsible sidewalls may include electronics (e.g., speaker wires), either internally and/or externally. In some examples, the collapsible sidewalls may include electronics even in the absence of speakers. For example, speaker wires may traverse the sidewall en route to speaker 526. In such an example, second side 530 may include one or more electronic connectors configured to mate with corresponding electronic connectors on kickstand 512.

In other examples, the collapsible sidewalls may be hinged at second side 530 and configured to stow within kickstand 512 in a closed configuration. In yet other examples, the collapsible sidewalls may be fully detachable and storable within device housing 508. Electronic connectors may be provided on one or more sides of the collapsible sidewalls where appropriate.

Figure 6:
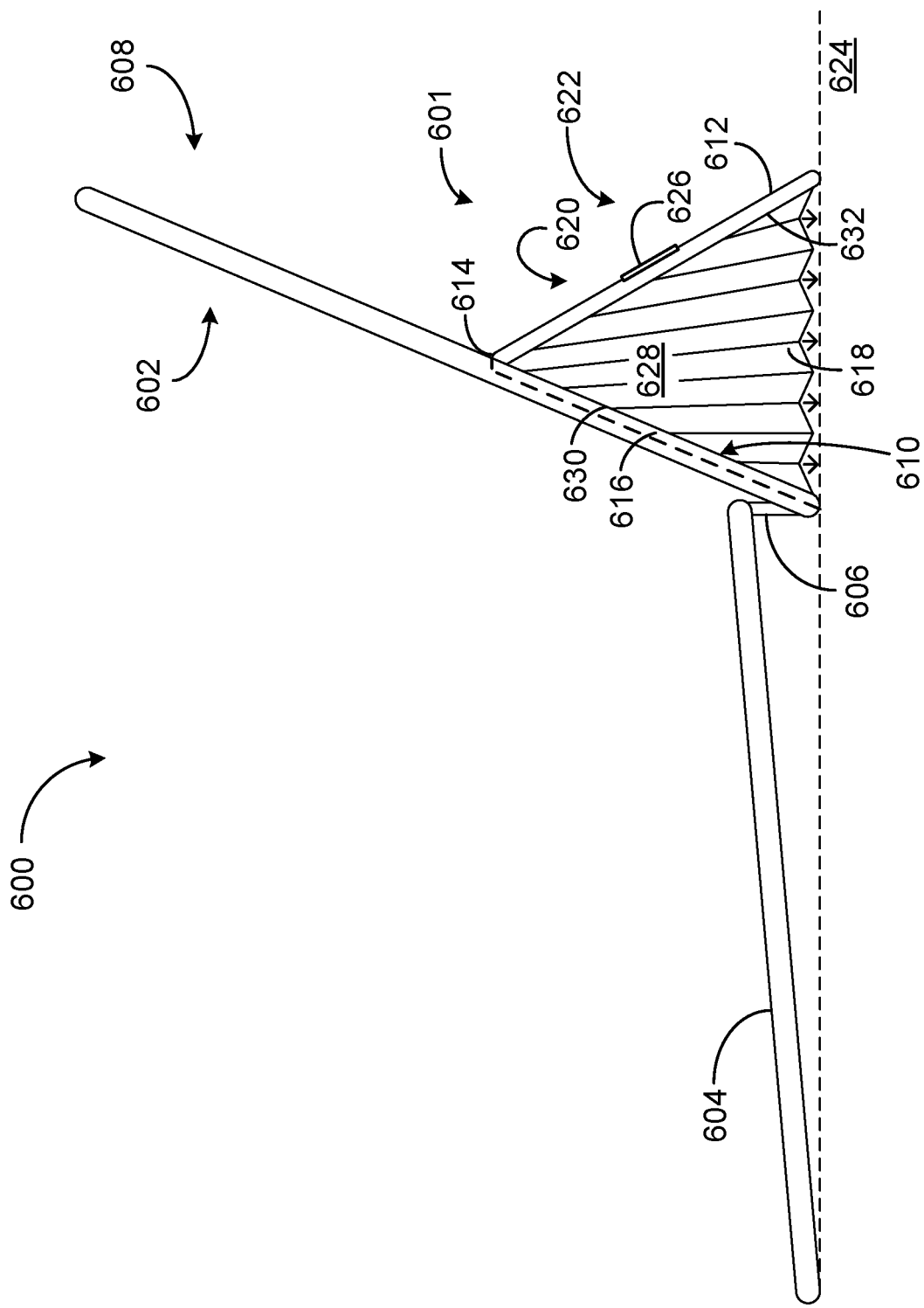

FIG. 6 shows another example electronic device 600 having an additional configuration for collapsible sidewalls. Electronic device 600 includes an expandable enclosure 601, display 602, input module 604, flexible hinge 606, device housing 608, device backing 610, kickstand 612, hinge 614, recess 616, and other components described with regard to electronic device 100. Electronic device 600 further includes a first collapsible sidewall 618, second collapsible sidewall 620 (occluded by and positioned opposite first collapsible sidewall 618). Faces of a resonance box 622 are defined by device backing 610, kickstand 612, first collapsible sidewall 618, second collapsible sidewall 620, and support surface 624. In this example, speaker 626 is placed on kickstand 612.

In this example, first collapsible sidewall 618 is depicted as an accordion flap with a plurality of folds 628. First collapsible sidewall 618 has a first side 630 that may be coupled to device backing 610, and a second side 632 that may be coupled to kickstand 612. In a closed conformation, folds 628 may be flattened between kickstand 612 and device backing 610. Folds 628 may stretch into an open configuration such that first collapsible sidewall 618 may be flush with support surface 624. In some examples, folds 628 may flatten in the open conformation so that first collapsible sidewall 618 is planar. However, in some examples first collapsible sidewall 618 may retain some topography in the open conformation. Folds 628 may enable resonance boxes to be formed at a plurality of kickstand angles, including a fully open conformation and one or more intermediate conformations.

Figure 7:
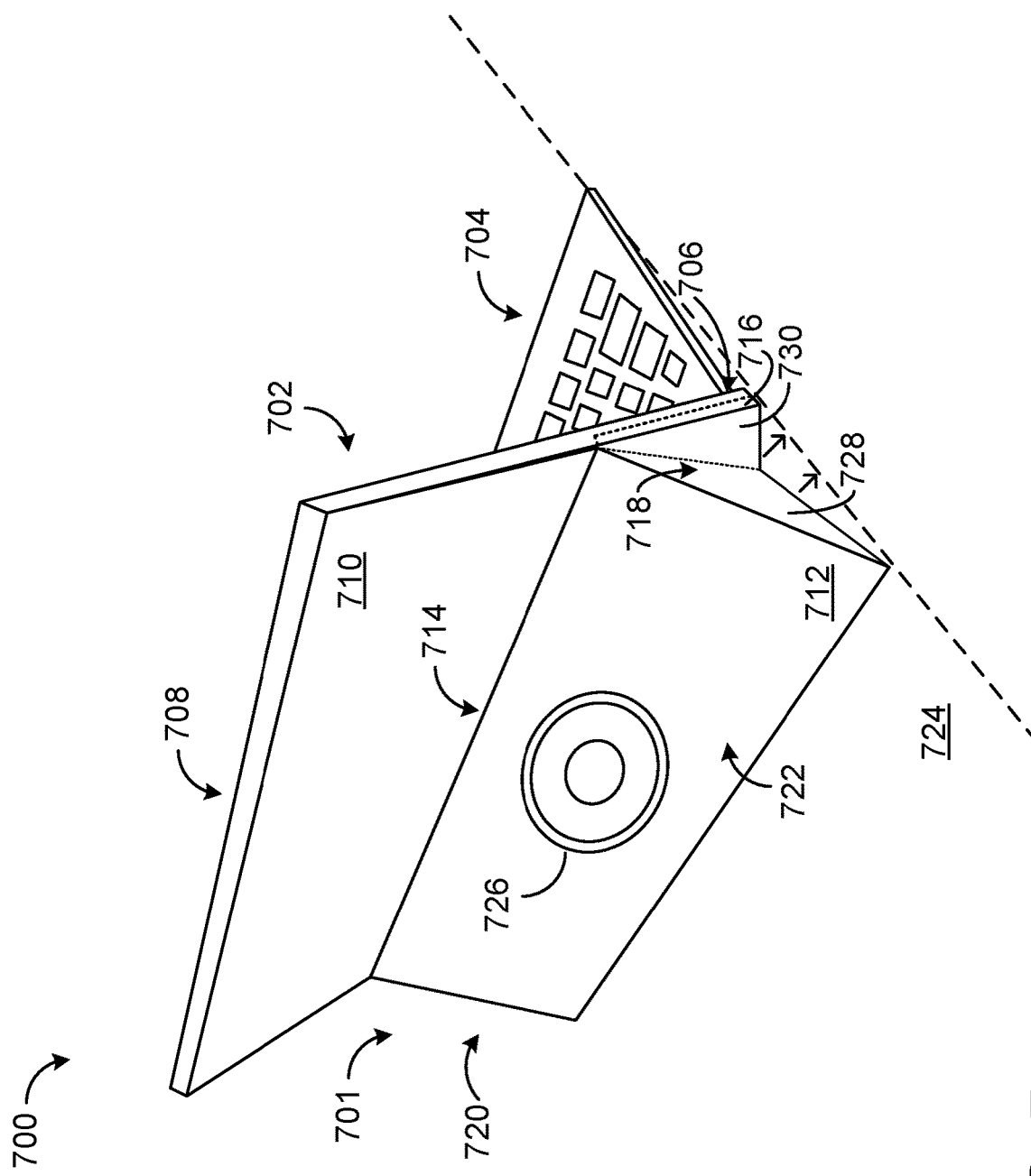

FIG. 7 shows yet another example electronic device 700 having an additional configuration for collapsible sidewalls. Electronic device 700 includes an expandable enclosure 701, display 702, input module 704, flexible hinge 706, device housing 708, device backing 710, kickstand 712, hinge 714, recess 716, and other components described with regard to electronic device 100. Electronic device 700 further includes a first collapsible sidewall 718, second collapsible sidewall 720 (occluded by kickstand 712, and positioned opposite first collapsible sidewall 718). Faces of a resonance box 722 are defined by device backing 710, kickstand 712, first collapsible sidewall 718, second collapsible sidewall 720, and support surface 724. In this example, speaker 726 is placed on kickstand 712.

In this example, first collapsible sidewall 718 is depicted as a foldable flap with two sub-flaps 728 and 730. First sub-flap 728 is coupled to kickstand 712 on a first side and to second sub-flap 730 on a second side. Second sub-flap 730 is coupled to device backing 710 on a first side and to first sub-flap 728 on a second side. In a closed conformation, the outer faces of first sub-flap 728 and second sub-flap 730 fold onto each other as they become flattened between kickstand 712 and device backing 710. In an open conformation, first sub-flap 728 and second sub-flap 730 fold outward to generate a planar face of first collapsible sidewall 718 that is flush with support surface 724.

In some examples, first sub-flap 728 and second sub-flap 730 may be identical, or may be mirror images of each other. In other examples, first sub-flap 728 and second sub-flap 730 may have different dimensions, enabling first collapsible sidewall 718 to attain a triangle shape that is non-equilateral in the open conformation. Such a configuration may be selected based on a desired kickstand angle in the open conformation.

Although two sub-flaps are depicted, in other examples each collapsible sidewall may include three or more sub-flaps. Multiple overlapping sub-flaps may enable kickstand 712 to be placed at multiple angles while still attaining a sealed resonator box. When in an open or intermediate conformation, first collapsible sidewall 718 may not be plum to support surface 724. Rather, first collapsible sidewall 718 may be folded out or rounded to enable multiple conformations.

Figure 8:
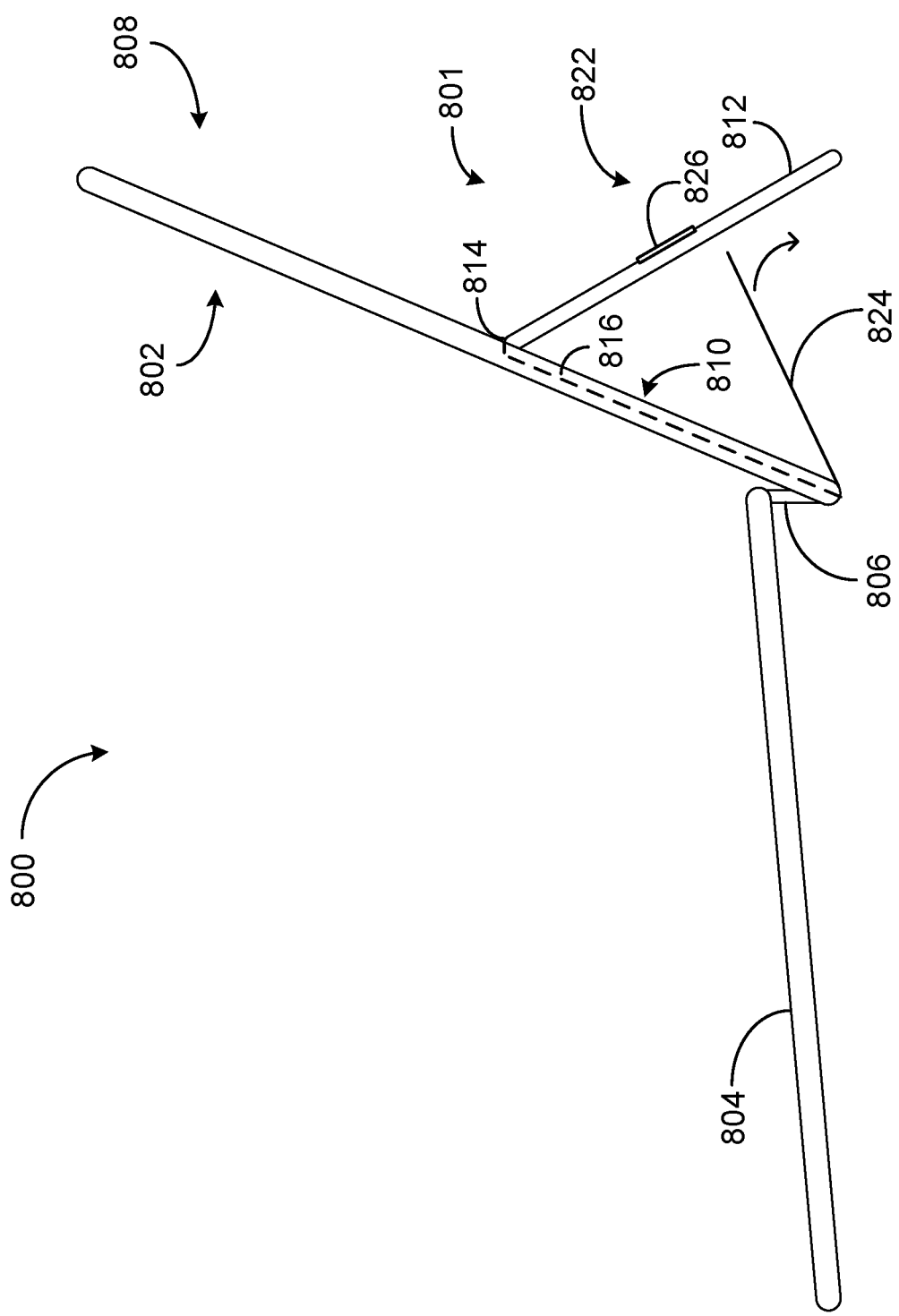
FIG. 8 shows an example electronic device including an expandable enclosure with a collapsible base panel.

FIG. 8 shows an example electronic device 800 having one configuration for a collapsible base panel. Electronic device 800 includes an expandable enclosure 801, display 802, input module 804, flexible hinge 806, device housing 808, device backing 810, kickstand 812, hinge 814, recess 816, and other components described with regard to electronic device 100. Electronic device 800 further includes a first collapsible sidewall and a second collapsible sidewall (not shown). Faces of a resonance box 822 are defined by device backing 810, kickstand 812, the first collapsible sidewall, the second collapsible sidewall, and a collapsible base panel 824. In this example, speaker 826 is placed on kickstand 812.

In this example, collapsible base panel 824 is coupled to device backing 810 via a hinge, allowing for collapsible base panel 824 to be folded into recess 816 in a closed configuration. Collapsible base panel may be configured to mate with kickstand 812 and with first and second collapsible sidewalls when in an open configuration. In other configurations, collapsible base panel 824 may be coupled to kickstand 812 via a hinge and configured to mate with device backing 810. In other examples, collapsible base panel 824 may be configured as having a plurality of folds, and to be coupled to both device backing 810 and kickstand 812 in both closed and open configurations.

Figure 9:
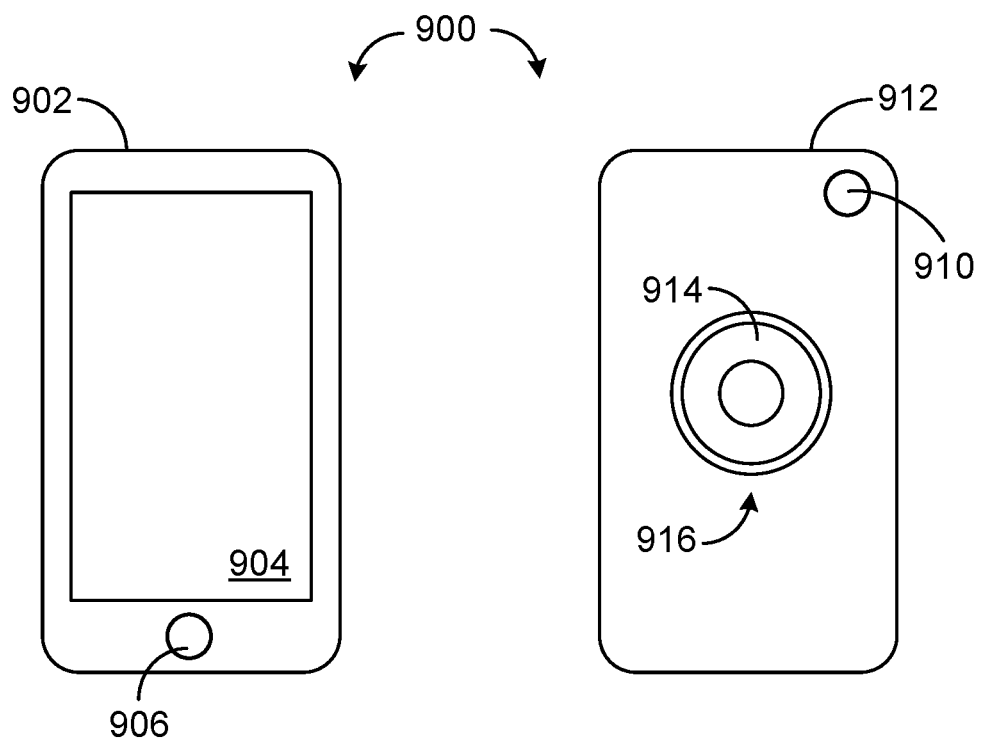
FIG. 9 shows an additional example electronic device including a speaker affixed to a backing of a device housing.

An expandable enclosure may also be appended to an electronic device in the absence of components such as a keyboard and kickstand. For example, FIG. 9 shows an electronic device 900 configured as a touch screen device, such as a mobile phone or tablet computer. A front surface 902 of electronic device 900 includes a touch-sensitive display 904, and an input button 906. Electronic device 900 further includes a device housing 908 which encompasses touch-sensitive display 904, input button 906, as well as internal components, such as a processor, storage machine, communications components, an energy storage device, etc. Electronic device 900 may further include a microphone, built-in speakers, input ports, etc. that may be located on a side of the device and thus are not shown. A camera 910 is depicted on a rear surface 912 of electronic device 900, opposite touch-sensitive display 904.

Rear surface 912 of electronic device 900 is depicted as including a speaker 914 coupled to an expandable enclosure 916. Speaker 914 and expandable enclosure 916 may be included within a common device housing with touch-sensitive display 904 (e.g., device housing 908), or may be included in a detachable case that may couple to device housing 908. In examples where speaker 914 is included within device housing 908, speaker 914 may be hard-wired to an amplifier within device housing 908. In examples where speaker 914 is included in a detachable case, speaker 914 may be wirelessly coupled to an amplifier and/or may be coupled to an amplifier via one or more input ports.

Figure 10:
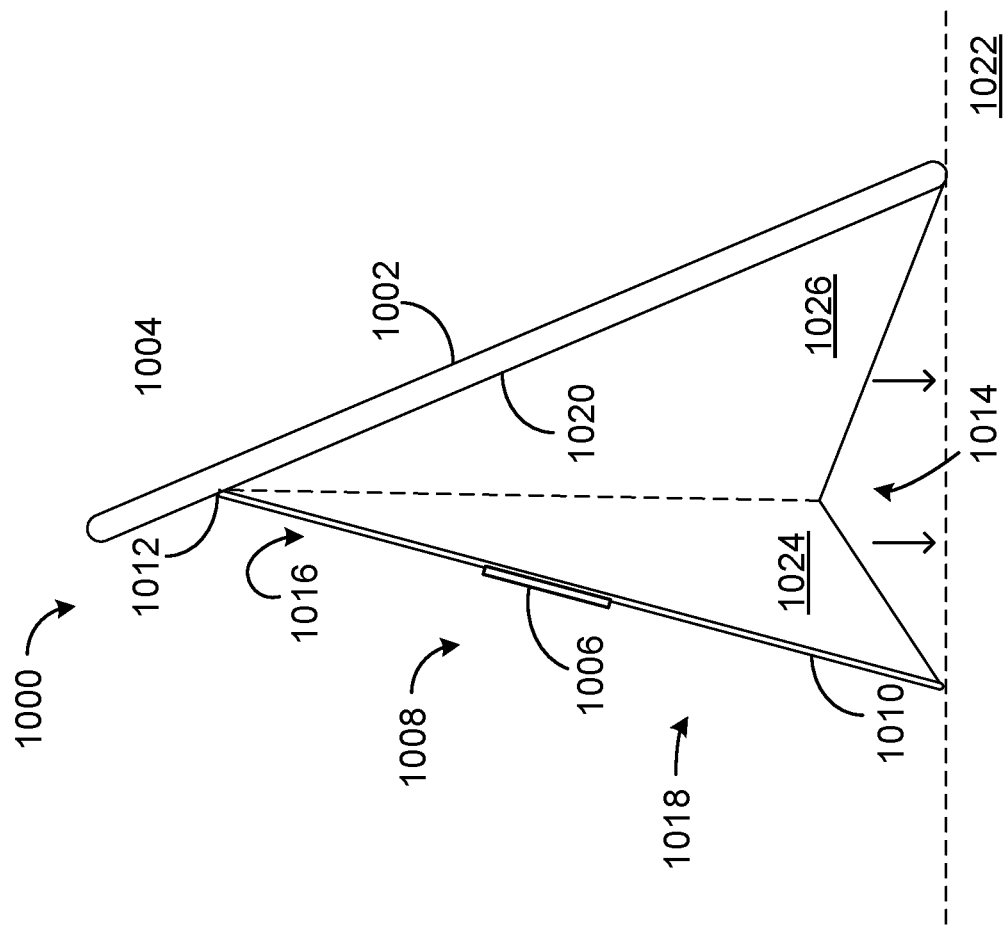
FIG. 10 shows an additional example electronic device including a speaker affixed to a kickstand.

The expandable enclosure may have numerous configurations. FIG. 10 shows one configuration that is similar in many ways to the electronic device described with regard to FIG. 7. Electronic device 1000 includes display 1002, device housing 1004, speaker 1006, expandable enclosure 1008, as well as other components described with regard to electronic device 900. In this example, expandable enclosure 1008 includes kickstand 1010, hinge 1012, first collapsible sidewall 1014, and second collapsible sidewall 1016 (occluded by, and positioned opposite first collapsible sidewall 1014). Faces of a resonance box 1018 are defined by kickstand 1010, device backing 1020, first collapsible sidewall 1014, second collapsible sidewall 1016, and support surface 1022.

Similar to first collapsible sidewall 718, first collapsible sidewall 1014 is depicted as a foldable flap with two sub-flaps 1024 and 1026. In a closed conformation, the outer faces of first sub-flap 1024 and second sub-flap 1026 fold onto each other as they become flattened between kickstand 1010 and device backing 1020. In an open conformation, first sub-flap 1024 and second sub-flap 1026 fold outward to generate a planar face of first collapsible sidewall 1014 that is flush with support surface 1022.

In other examples, first collapsible sidewall 1014 and second collapsible sidewall 1016 may take other forms, such as the hinged flap described with regard to FIG. 5, or the multi-fold structure described with regard to FIG. 6. Hinge 1012 may be positioned so as not to obscure a camera or other components at the rear of electronic device 1000. Hinge 1012 may span the length or width of electronic device 1000, or may span merely a portion of the device dimensions. Other configurations are possible, such as two outward folding triangle-shaped flaps which generate a pyramidal shape when in an open configuration.

Figure 11:
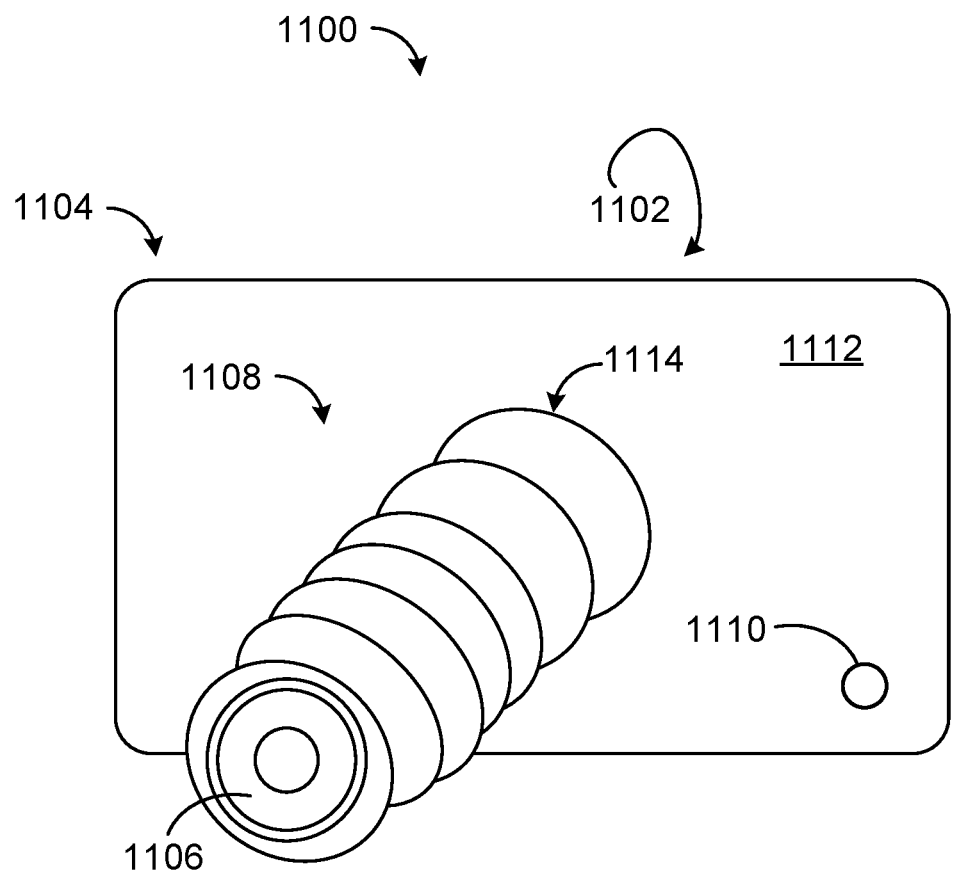
FIG. 11 shows an additional example electronic device including a speaker affixed to a coiled tube.

An additional example is depicted in FIG. 11. FIG. 11 shows electronic device 1100. Electronic device 1100 includes display 1102 (not shown), device housing 1104, speaker 1106, expandable enclosure 1108, camera 1110, device backing 1112, as well as other components described with regard to electronic device 900.

In this example, expandable enclosure 1108 includes a coiled tube 1114. A first side of coiled tube 1114 is affixed to device backing 1112. Speaker 1106 is placed at a second, opposite side of coiled tube 1114. A user desiring to open expandable enclosure 1108 and generate resonance box 1116 may expand coiled tube 1114 by pulling speaker 1106 away from device backing 1112. Coiled tube 1114 may include a single, spring like coil, or may include a plurality of collapsible circular rings (e.g., concentric rings when in a closed configuration). While shown as predominantly circular or elliptical, other shapes and designs are possible. Coiled tube 1114 may include on or more locking mechanisms to brace expandable enclosure 1108 in the open and closed configurations.

In some examples, expandable enclosure 1108 may support electronic device 1100 when placed on a support surface, but in other examples, expandable enclosure 1108 may not support electronic device 1100. Coiled tube 1114 may be configured to adopt numerous partially-open configurations, but a certain degree of openness may be required to generate a functional resonance box. In some examples, two or more expandable enclosures may be affixed to device backing 1112 (e.g., larger format mobile phones and tablet computers). Expandable enclosure 1108 may be positioned on device backing so as not to interfere with camera 1110 other devices. For example, expandable enclosure may be a collapsible gripping and/or device support socket in a closed configuration.

For systems wherein the expandable enclosure is configurable in multiple positions, the sound generated by the resonance box will change based on the position of the enclosure. Further, for examples where one face of the resonance box is a support surface, the characteristics of the resonance box will change based on the characteristics of the support surface.

Figure 12:
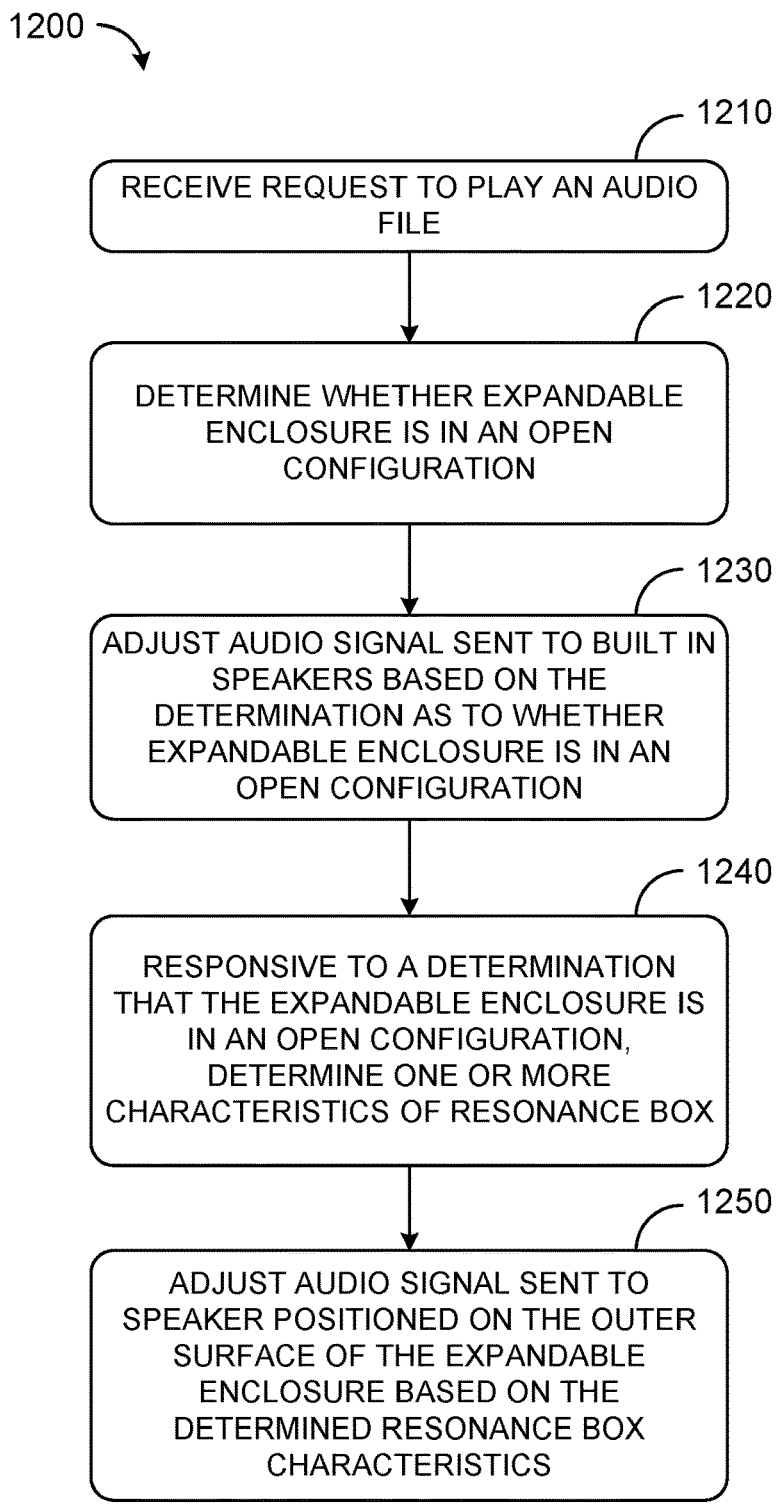
FIG. 12 shows an example method for adjusting audio output by an electronic device having a speaker affixed to an expandable enclosure.

FIG. 12 depicts an example method 1200 for adjusting audio output by an electronic device having a speaker affixed to an expandable enclosure. At 1210, method 1200 includes receiving a request to play an audio file. For example, a user may select an audio file or mixed media file for playback. In other examples, an audio or mixed media file may automatically playback, for example when a user visits a particular web site. Audio files may be pre-recorded or may be actively generated, such as for a video game or phone call.

At 1220, method 1200 includes determining whether an expandable enclosure is in an open conformation. In other words, it may be determined whether an expandable enclosure has formed a resonance box and/or is otherwise configured to emit audio through one or more speakers. Determining whether an expandable enclosure is in an open conformation may be based on a signal received from one or more components of the expandable enclosure, e.g., locking a collapsible sidewall or kickstand into place may passively transmit a signal to a processor indicating that the expandable enclosure is in an open conformation. In other examples, a test signal may be sent to a speaker on the expandable enclosure to determine a characteristic of the expandable enclosure, such as speaker impedance.

At 1230, method 1200 includes adjusting an audio signal sent to built-in speakers of the electronic device based on the determination as to whether the expandable enclosure is in an open conformation. For example, if the expandable enclosure is not in an open conformation, the entire audio signal may be sent to the built-in speakers. If the expandable enclosure is in an open conformation, built-in speakers may be sent a partial audio signal (e.g., high-frequencies), or may not be sent any audio signal at all.

At 1240, method 1200 includes, responsive to a determination that the expandable enclosure is in an open conformation, determining one or more characteristics of the resonance box. The acoustics of the resonance box will be altered based on the total enclosed volume and the dimensions of that volume. In some examples, the expandable enclosure may have two or more pre-defined positions (e.g., kickstand clicked into place). Each pre-defined position may have a pre-determined acoustic environment that may be recalled based on the current position. Additionally or alternatively, the speaker impedance may be measured in real time. Characteristics of the acoustic environment within the resonance box may then be determined based on the speaker impedance. For example, different support surfaces may be made from different materials, and thus have different acoustic characteristics.

At 1250, method 1200 includes adjusting the audio signal sent to the speaker positioned on the outer surface of the expandable enclosure based on the determined characteristics of the resonance box. As the audio file plays, the acoustic characteristics of the resonance box may be re-determined and the audio signal re-adjusted. Further, the audio signal sent to the built-in speakers may be adjusted based on the audio signal sent to the speaker coupled to the resonance box.

In some embodiments, method 1200 and/or other methods and processes described herein may be tied to a computing system of one or more computing devices. In particular, such methods and processes may be implemented as a computer-application program or service, an application-programming interface (API), a library, and/or other computer-program product.

Figure 13:
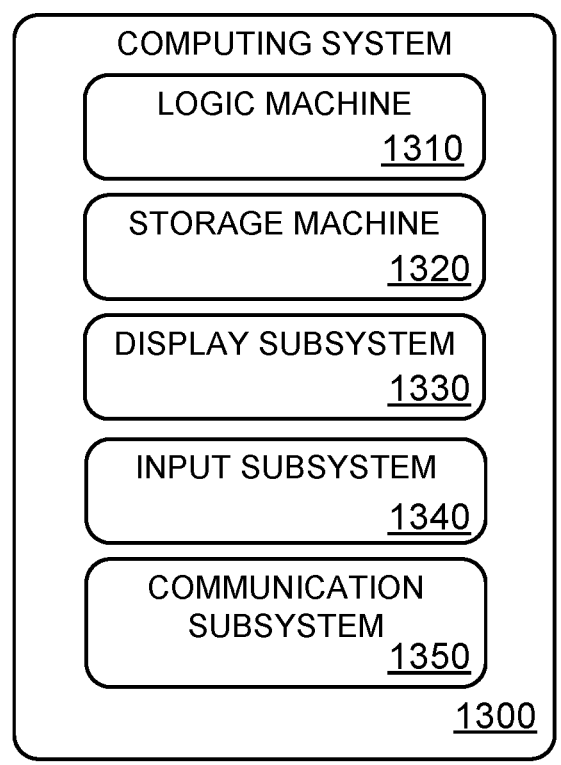
FIG. 13 schematically shows an example computing device.

FIG. 13 schematically shows a non-limiting embodiment of a computing system 1300 that can enact one or more of the methods and processes described above. Computing system 1300 is shown in simplified form. Computing system 1300 may take the form of one or more personal computers, tablet computers, gaming devices, mobile computing devices, mobile communication devices (e.g., smart phone), and/or other computing devices. Electronic devices 100, 300, 400, 500, 600, 700, 800, 900, 1000, and 1100 are nonlimiting examples of computing system 1300.

Computing system 1300 includes a logic machine 1310 and a storage machine 1320. Computing system 1300 may optionally include a display subsystem 1330, input subsystem 1340, communication subsystem 1350, and/or other components not shown in FIG. 13.

Logic machine 1310 includes one or more physical devices configured to execute instructions. For example, the logic machine may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic machine may include one or more processors configured to execute software instructions. Additionally or alternatively, the logic machine may include one or more hardware or firmware logic machines configured to execute hardware or firmware instructions. Processors of the logic machine may be single-core or multi-core, and the instructions executed thereon may be configured for sequential, parallel, and/or distributed processing. Individual components of the logic machine optionally may be distributed among two or more separate devices, which may be remotely located and/or configured for coordinated processing. Aspects of the logic machine may be virtualized and executed by remotely accessible, networked computing devices configured in a cloud-computing configuration.

Storage machine 1320 includes one or more physical devices configured to hold instructions executable by the logic machine to implement the methods and processes described herein. When such methods and processes are implemented, the state of storage machine 1320 may be transformed—e.g., to hold different data.

Storage machine 1320 may include removable and/or built-in devices. Storage machine 1320 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage machine 1320 may include volatile, nonvolatile, dynamic, static, read/write, read-only, random-access, sequential-access, location-addressable, file-addressable, and/or content-addressable devices.

It will be appreciated that storage machine 1320 includes one or more physical devices. However, aspects of the instructions described herein alternatively may be propagated by a communication medium (e.g., an electromagnetic signal, an optical signal, etc.) that is not held by a physical device for a finite duration.

Aspects of logic machine 1310 and storage machine 1320 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, display subsystem 1330 may be used to present a visual representation of data held by storage machine 1320. This visual representation may take the form of a graphical user interface (GUI). As the herein described methods and processes change the data held by the storage machine, and thus transform the state of the storage machine, the state of display subsystem 1330 may likewise be transformed to visually represent changes in the underlying data. Display subsystem 1330 may include one or more display devices utilizing virtually any type of technology. Such display devices may be combined with logic machine 1310 and/or storage machine 1320 in a shared enclosure, or such display devices may be peripheral display devices.

When included, input subsystem 1340 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, communication subsystem 1350 may be configured to communicatively couple computing system 1300 with one or more other computing devices. Communication subsystem 1350 may include wired and/or wireless communication devices compatible with one or more different communication protocols. As non-limiting examples, the communication subsystem may be configured for communication via a wireless telephone network, or a wired or wireless local- or wide-area network. In some embodiments, the communication subsystem may allow computing system 1300 to send and/or receive messages to and/or from other devices via a network such as the Internet.

In one example, an electronic device comprises a display; an expandable enclosure positioned opposite the display, the expandable enclosure operable between at least a closed configuration and an open configuration, such that in the open configuration, the expandable enclosure defines faces of a resonance box; and one or more speakers positioned on an outer surface of the expandable enclosure. In such an example, or any other example, the expandable enclosure may additionally or alternatively be operable to one or more partially open configurations. In any of the preceding examples, or any other example, the one or more partially open configurations may additionally or alternatively include one or more discrete positions. In any of the preceding examples, or any other example, the one or more partially open configurations may additionally or alternatively include a continuum of positions. In any of the preceding examples, or any other example, the expandable enclosure may additionally or alternatively include a kickstand coupled to a backing of a device housing via a hinge, and further includes one or more collapsible sidewalls attached to both the kickstand and the backing of the device housing, each collapsible sidewall configured such that in the closed configuration, the collapsible sidewalls are flattened between the kickstand and the backing of the device housing, and in the open configuration, the collapsible sidewalls, kickstand, and backing of the device housing define faces of the resonance box. In any of the preceding examples, or any other example, the expandable enclosure may additionally or alternatively include a coiled tube having a first end and a second end, and wherein the first end is affixed to a backing of a device housing and at least one of the one or more speakers is affixed to the second end.

In another example, an electronic device comprises a display; an energy storage device configured to power at least the display; a device housing positioned around the energy storage device and at least a rear of the display; a kickstand hinged to a backing of the device housing, opposite the display, the kickstand configured to be flush with the backing when in a closed configuration, and to support the display when in an open configuration; one or more collapsible sidewalls attached to both the kickstand and the backing of the device housing, each collapsible sidewall configured such that in the closed configuration, the collapsible sidewalls are flattened between the kickstand and the backing of the device housing, and in the open configuration, the collapsible sidewalls, kickstand, and backing of the device housing define faces of a resonance box; and one or more speakers oriented so that a drive magnet assembly faces an interior of the resonance box, and so that a speaker cone faces an exterior of the resonance box. In such an example, or any other example, one or more speakers may additionally or alternatively be positioned on the kickstand. In any of the preceding examples, or any other example, one or more speakers may additionally or alternatively be positioned on the one or more collapsible sidewalls. In any of the preceding examples, or any other example, the electronic device may additionally or alternatively comprise one or more speakers attached to the device housing, and wherein the speakers attached to the device housing receive higher frequency audio signals, and wherein the one or more speakers positioned at the resonance box receive lower frequency audio signals. In any of the preceding examples, or any other example, the electronic device may additionally or alternatively comprise a collapsible base configured to mate with the kickstand, the backing of the device housing, and the one or more collapsible sidewalls to generate an enclosed resonance box. In any of the preceding examples, or any other example, the speakers may additionally or alternatively be coupled to an amplifier powered by the energy storage device. In any of the preceding examples, or any other example, the sidewalls may additionally or alternatively be hinged to one of the kickstand and the backing of the device housing when in the closed configuration, and may additionally or alternatively be coupled to both the kickstand and the backing of the device housing when in the open configuration. In any of the preceding examples, or any other example, the sidewalls may additionally or alternatively include two or more sub-flaps configured to fold together when in the closed configuration. In any of the preceding examples, or any other example, the sidewalls may additionally or alternatively be coupled to both the kickstand and the backing of the device housing when in the open configuration, and the sidewalls may additionally or alternatively include a plurality of folds configured to flatten together in the closed configuration. In any of the preceding examples, or any other example, the display may additionally or alternatively be separable from a device case that includes at least an input module, the kickstand, and the one or more speakers.

In yet another example, an electronic device, comprises a display; a device housing; an expandable enclosure positioned on a backing of the device housing, opposite the display, the expandable enclosure operable between at least a closed configuration and one or more open configurations, such that in each open configuration, the expandable enclosure defines faces of a resonance box; one or more speakers positioned on an outer surface of the expandable enclosure; one or more built-in speakers positioned on the device housing; and a storage machine holding instructions executable by a logic machine to: receive a request to play an audio file; determine whether the expandable enclosure is in an open configuration; adjust the audio signal sent to the built-in speakers based on the determination as to whether the expandable enclosure is in an open configuration; responsive to a determination that the expandable enclosure is in an open configuration, determine one or more characteristics of the resonance box; and adjust the audio signal sent to the one or more speakers positioned on the outer surface of the expandable enclosure based on the determined resonance box characteristics. In such an example, or any other example, the expandable enclosure may additionally or alternatively be operable between one or more discrete open configurations, and wherein determining one or more characteristics of the resonance box includes determining in which discrete open configuration the expandable enclosure is positioned. In any of the preceding examples, or any other example, determining one or more characteristics of the resonance box may additionally or alternatively include determining an impedance of the one or more speakers positioned on the outer surface of the expandable enclosure. In any of the preceding examples, or any other example, the storage machine may additionally or alternatively hold instructions executable by the logic machine to: adjust the audio signal sent to the one or more built-in speakers based on the determined resonance box characteristics.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. An electronic device, comprising:
    a display having a display surface facing a first direction and a display backing facing a second direction, substantially opposite the first direction;
    an expandable enclosure positioned on the display backing, the expandable enclosure operable between at least a closed configuration and an open configuration, such that in the open configuration, the expandable enclosure defines faces of a resonance box; and
    one or more speakers positioned on an outer surface of the expandable enclosure, wherein at least one of the one or more speakers moves relative to the display as the expandable enclosure moves between the closed configuration and the open configuration.

2. The electronic device of claim 1, wherein the expandable enclosure is operable to one or more partially open configurations.

3. The electronic device of claim 2, wherein the one or more partially open configurations include one or more discrete positions.

4. The electronic device of claim 2, wherein the one or more partially open configurations include a continuum of positions.

5. The electronic device of claim 1, wherein the expandable enclosure includes a kickstand coupled to a backing of a device housing via a hinge, and further includes one or more collapsible sidewalls attached to both the kickstand and the backing of the device housing, each collapsible sidewall configured such that in the closed configuration, the collapsible sidewalls are flattened between the kickstand and the backing of the device housing, and in the open configuration, the collapsible sidewalls, kickstand, and backing of the device housing define faces of the resonance box.

6. The electronic device of claim 1, wherein the expandable enclosure includes a coiled tube having a first end and a second end, and wherein the first end is affixed to a backing of a device housing and at least one of the one or more speakers is affixed to the second end.

7. An electronic device, comprising:
a display;
an energy storage device configured to power at least the display;
a device housing positioned around the energy storage device and at least a rear of the display;
a kickstand hinged to a backing of the device housing, opposite the display, the kickstand configured to be flush with the backing when in a closed configuration, and to support the display when in an open configuration;
one or more collapsible sidewalls attached to both the kickstand and the backing of the device housing, each collapsible sidewall configured such that in the closed configuration, the collapsible sidewalls are flattened between the kickstand and the backing of the device housing, and in the open configuration, the collapsible sidewalls, kickstand, and backing of the device housing define faces of a resonance box; and
one or more speakers oriented so that a drive magnet assembly faces an interior of the resonance box, and so that a speaker cone faces an exterior of the resonance box.

8. The electronic device of claim 7, wherein one or more speakers are positioned on the kickstand.

9. The electronic device of claim 7, wherein one or more speakers are positioned on the one or more collapsible sidewalls.

10. The electronic device of claim 7, further comprising one or more speakers attached to the device housing, wherein the speakers attached to the device housing receive higher frequency audio signals, and wherein the one or more speakers positioned at the resonance box receive lower frequency audio signals.

11. The electronic device of claim 7, further comprising a collapsible base configured to mate with the kickstand, the backing of the device housing, and the one or more collapsible sidewalls to generate an enclosed resonance box.

12. The electronic device of claim 7, wherein the speakers are coupled to an amplifier powered by the energy storage device.

13. The electronic device of claim 7, wherein the sidewalls are hinged to one of the kickstand and the backing of the device housing when in the closed configuration, and coupled to both the kickstand and the backing of the device housing when in the open configuration.

14. The electronic device of claim 7, wherein the sidewalls include two or more sub-flaps configured to fold together when in the closed configuration.

15. The electronic device of claim 7, wherein the sidewalls are coupled to both the kickstand and the backing of the device housing when in the open configuration, and wherein the sidewalls include a plurality of folds configured to flatten together in the closed configuration.

16. The electronic device of claim 7, wherein the display is separable from a device case that includes at least an input module, the kickstand, and the one or more speakers.

17. An electronic device, comprising:
a display;
a device housing;
an expandable enclosure positioned on a backing of the device housing, opposite the display, the expandable enclosure operable between at least a closed configuration and one or more open configurations, such that in each open configuration, the expandable enclosure defines faces of a resonance box;
one or more speakers positioned on an outer surface of the expandable enclosure;
one or more built-in speakers positioned on the device housing; and
a storage machine holding instructions executable by a logic machine to:
receive a request to play an audio file;
determine whether the expandable enclosure is in an open configuration;
adjust the audio signal sent to the built-in speakers based on the determination as to whether the expandable enclosure is in an open configuration;
responsive to a determination that the expandable enclosure is in an open configuration, determine one or more characteristics of the resonance box; and
adjust the audio signal sent to the one or more speakers positioned on the outer surface of the expandable enclosure based on the determined resonance box characteristics.

18. The electronic device of claim 17, wherein the expandable enclosure is operable between one or more discrete open configurations, and wherein determining one or more characteristics of the resonance box includes determining in which discrete open configuration the expandable enclosure is positioned.

19. The electronic device of claim 17, wherein determining one or more characteristics of the resonance box includes determining an impedance of the one or more speakers positioned on the outer surface of the expandable enclosure.

20. The electronic device of claim 17, where the storage machine holds instructions executable by the logic machine to:
adjust the audio signal sent to the one or more built-in speakers based on the determined resonance box characteristics.

* * * * *